United States Patent [19]

Hinterman et al.

[11] Patent Number: 5,389,118
[45] Date of Patent: Feb. 14, 1995

[54] ABRASIVE TOOL HAVING FILM-COVERED CBN GRITS BONDED BY BRAZING TO A SUBSTRATE

[75] Inventors: Hans E. Hinterman, Anet; Ajay K. Chattopadhyay, Hauterive, both of Switzerland

[73] Assignee: CSEM Centre Suisse d'Electronique et de Microtechnique S.A. - Recherche et Developpement, Neuchatel, Switzerland

[21] Appl. No.: 153,626

[22] Filed: Nov. 17, 1993

[30] Foreign Application Priority Data

Nov. 20, 1992 [GB] United Kingdom ............... 9224320

[51] Int. Cl.⁶ .............................................. B24D 3/00
[52] U.S. Cl. ........................................ 51/295; 51/307
[58] Field of Search ................. 51/293, 295, 308, 309, 51/307; 427/212, 215, 217

[56] References Cited

U.S. PATENT DOCUMENTS

| Re. 30,503 | 2/1981 | Lee et al. | 51/307 |
| 3,248,189 | 4/1966 | Harris, Jr. | 51/295 |
| 3,378,361 | 4/1968 | Harris, Jr. | 51/309 |
| 3,520,667 | 7/1970 | Taylor | 51/295 |
| 3,615,309 | 10/1971 | Dawson | 51/295 |
| 3,617,347 | 11/1971 | Kuratomi | 427/215 |
| 3,868,235 | 2/1975 | Held | 51/309 |
| 3,894,673 | 7/1975 | Lowder | 51/309 |
| 4,011,064 | 3/1977 | Lee et al. | 51/295 |
| 4,018,576 | 4/1977 | Lowder et al. | 51/309 |
| 4,063,909 | 12/1977 | Mitchell | 51/295 |
| 4,110,084 | 8/1978 | Lee et al. | 51/309 |
| 4,225,322 | 9/1980 | Knemeyer | 51/295 |
| 4,374,651 | 2/1983 | Lee et al. | 51/309 |
| 4,399,167 | 8/1983 | Pipkin | 51/309 |
| 4,426,209 | 1/1984 | Sarin et al. | 51/295 |
| 4,505,720 | 3/1985 | Gabor et al. | 51/295 |
| 4,699,227 | 10/1987 | Wardley | 175/329 |
| 4,776,862 | 10/1988 | Wiand | 51/293 |
| 4,850,523 | 7/1989 | Slutz | 51/295 |
| 5,000,760 | 3/1991 | Ohtsubo | 51/308 |
| 5,030,596 | 7/1991 | Kume et al. | 51/309 |
| 5,129,918 | 7/1992 | Chattopadhay | 51/295 |

FOREIGN PATENT DOCUMENTS

2249513A 5/1992 United Kingdom.

*Primary Examiner*—Mark L. Bell
*Assistant Examiner*—Deborah Jones

[57] ABSTRACT

The invention concerns in one aspect a CBN abrasive tool comprising a metal, ceramic or cemented carbide substrate and a single layer of CBN grits bonded to said substrate by a brazing alloy, characterized in that the surface chemistry of said CBN grits is modified by depositing thereon a film of silicon carbide. The invention also concerns, in another aspect, a method of manufacturing a CBN abrasive tool comprising the steps of providing a metal, ceramic or cemented carbide substrate; providing a plurality of CBN grits; depositing a film of silicon carbide on said CBN grits; and, bonding the carbide film-coated CBN grits to said substrate by a brazing alloy.

5 Claims, No Drawings

ABRASIVE TOOL HAVING FILM-COVERED CBN GRITS BONDED BY BRAZING TO A SUBSTRATE

The present invention relates generally to abrasive tools, and in particular to abrasive tools comprising a substrate and a single layer of CBN (cubic boron nitride) grits bonded to the substrate by a braze alloy.

In recent years, the brazing of abrasive particles to a suitable substrate has gained importance in the material processing industry with a view to manufacturing tools which can outperform conventional galvanically bonded diamond tools.

The fundamental requirement of a material to be used for brazing abrasive crystals is that it should be capable of wetting and bonding the abrasive grit surface spontaneously and, to reduce the cost of production, no pressure application should be used to induce wetting.

The chemical nature of bonding obtained during brazing results in less bonding material being used in comparison to that required during galvanic bonding, which mainly provides a mechanical hold in the abrasive grits. This characteristic of the brazed bond results in an abrasive tool which has a higher material removal rate and longer life than that of a galvanically bonded tool.

Diamond abrasive elements are used in many existing abrasive tools. However, as conventional Cu or Ag based alloys can ordinarily wet metal but cannot wet non-metallic materials, a new class of alloys called "active" brazing alloys have been developed which can quite effectively wet and enable the untreated surface of non-metallic materials to be brazed directly.

Cu—Ti, Sn—Ti and Ag—Ti are examples of binary active alloys which are known in the art. Ternary alloys such as Cu—Sn—Ti or Cu—Ag—Ti are also well known brazing materials. Elements like In are also found in commercially available active alloys. Each of these alloys can be used for direct brazing of graphite, diamond and various oxide, carbide and nitride ceramic abrasive elements. However, as described in U.S. Pat. Nos. 3,894,673 and 4,018,567, these alloys are low in strength and wear resistance and do not provide suitable bonding for to enable the fabrication of monolayer abrasive tools which include these abrasive elements.

For a brazed diamond monolayer tool to surpass a similar galvanically bonded tool in terms of grit retention and tool life, one needs to use one of the readily available, very hard and durable Ni—Cr brazing alloys. U.S. Pat. Nos. 3,894,673 and 4,018,567 indicate that such alloys are found to spontaneously wet an untreated diamond surface. Chromium is found to be the principle wetting agent.

Methods of applying and metallurgically bonding hard carbide particles to the surface of a metal substrate are disclosed in U.S. Pat. Nos. 3,868,235, 3,378,361, 3,615,309 and 3,248,189. The bonding materials described therein are principally Ni—Cr based alloys containing other elements such as Fe, B and Si, and in most cases can be obtained commercially. U.S. Pat. No. 3,248,189 suggests that the inclusion of Mo and Co in these alloys improves the bond provided by the matrix. Co—Cr—W type "Stellite" aloys have also been found to be suitable in U.S. Pat. No. 3,615,309.

PCT International Patent Application no. PCT/US83/01946 teaches a method of making a monolayer abrading tool with tungsten carbide particles. A tape of powdered Ni—Cr brazing alloy blended into a soft, flexible matrix is secured to a steel substrate. The abrasive particles are then embedded in the tape. The tool is heated to at least the liquidus temperature of the brazing material to set the abrasive particles and thereafter is rapidly cooled to solidify the brazing material so as to produce a metallic matrix.

The short-coming of the above-mentioned tools is that they cannot be used for grinding steel because of the vigorous reaction between the work-material and the abrasive particles, which causes rapid wear of the tool. In addition, the above-mentioned patents disclose only the use of these brazing materials in relation to the bonding of hard carbide and diamond particles.

CBN grits, which are known to wear less rapidly in steel-grinding applications, can be used in such abrasive tools as a substitute for diamond particles. Nothing in these patents, however, discloses nor suggests the use of CBN grits or how CBN grits may actually be brazed to a suitable substrate.

Applicant has found that Ni-based alloys containing Cr, which can effectively braze uncoated diamond particles below 1200° C., cannot wet or strongly bond CBN grits to a subtrate. Grinding tests have shown that CBN tools brazed in this manner suffer from premature grit dislodgement due to poor adhesion between the matrix and the grit surface. This situation remains unchanged even when the amount of chromium in the alloy is raised to 29%. It can thus be seen that Ni—Cr alloys cannot effectively act as a wetting agent or react with CBN when bonded to a subtrate with existing braze alloys.

U.S. Pat. No. 5,129,918, by the present inventors, proposes one solution to this problem, that being a low cost, practical method of brazing a monolayer of CBN grits to a subtrate with a strong and durable alloy. This patent describes a CBN tool which is made by depositing a film of Ti—C on the CBN grits prior to brazing with a Ni-based alloy. The Ti—C film is found to have good adherence with the CBN grits and change their surface chemistry so as to improve the wettability of the grits and their bondability with several commercially available Ni-based alloys which show good flow characteristics on Ti—C film below 1200° C. These characteristics depend in part on the melting point of the alloy and its the presence of various elements therein. Due to the poor flow characteristics on Ti—C film below 1200° C. of several Ni-based alloys having high melting points, a second coating of a carbide of group VI transition elements (e.g. CrC) is sometimes used to sufficiently enhance the wetting of the grits.

Several methods are known for coating diamond abrasive particles to enhance their adhesion with resinoid, metal and ceramic binders. Such as process is disclosed in U.S. Pat. No. 3,520,667, wherein an adherent surface coating of silicon carbide is provided on diamond abrasive particles by suspending them in a gaseous atmosphere comprising a volatile silicon compound such as methyltrichlorosilane and forming, by thermal decomposition of the silicon compound, a silicon carbide layer on the particles.

Another vapor deposition technique is disclosed in U.S. Pat. No. 3,617,347, wherein diamond powder is coated with a thin film of silicon carbide formed from the gaseous silicon compound and the diamond patricles themselves. This thin silicon carbide coating is then recoated with elemental silicon.

However, neither of these patents teaches nor suggests the use of a Si—C film on abrasive particles in brazing. Indeed, U.S. Pat. Nos. 3,894,673 and 4,018,567 specifically teach away from the use of such a film, clearly indicating that such a Si—C coating is not required at all when Ni—Cr alloys are used for brazing diamond particles, as these alloys spontaneously wet and strongly bond to the surface of uncoated diamond. This is in marked contrast to the findings of the Applicant which clearly establish the need for a film of suitable material, which can enhance the wettability of an alloy towards the CBN grits.

The coating of diamond or CBN particles with Si—C is disclosed in European patent no. 0 061 605, but in this document the coated particles are bonded to a metal substrate using a conventional resin, metal or ceramic binder. The Si—C film is said to be conformationally irregular and extremely rough in texture (independant of the surface roughness of the crystal). Further, the thickness of the Si—C film according to this disclosure is greater than can be achieved by conventional vapor deposition techniques. It is claimed that the bonding of the crystals, coated with this type of Si—C film, used with a conventional resinoid, metallic or ceramic matrix binder, is better than can be achieved with a vapor deposited Si—C film. By way of explanation, it is known that the general roughness of the bonded surface plays a dominant role in the nature of the bond, when this latter is based upon physical interlocking and when the contribution of chemical adhesion is minimal, as is the case when bonding is achieved with a conventional binder. Again, no suggestion is made as to the use of a Si—C film on abrasive particles in brazing applications.

Thus, there remains a demand for a low cost practical method for brazing a monolayer of CBN grits to a substrate with strong and durable alloys.

It is an object of the present invention to provide CBN abrasive tool, and method for the manufacture thereof, which addresses this demand and/or at the very least provides the public with a choice.

With this object in mind, one aspect of the present invention provides a CBN abrasive tool comprising a metal, ceramic or cemented carbide substrate and a single layer of CBN grits bonded to said substrate by a brazing alloy, characterized in that the surface chemistry of the CBN grits is modified by depositing thereon a film of Si carbide.

Another aspect of the present invention provides a method of manufacturing a CBN abrasive tool comprising the steps of:
providing a metal, ceramic or cemented carbide substrate;
providing a plurality of CBN grits;
depositing a film of silicone carbide on the CBN grits; and,
bonding the carbide film-coated CBN grits to said substrate by a brazing alloy.

A CBN abrasive tool is thus provided in which a well adherent and coherent film of Si—C, or other carbide selected from the group of carbides containing elements of the group IVA of the periodic table, is deposited on the CBN grits which is beneficial for increasing wettability and bondability of brazing alloys, mainly through chemical reactivity and adhesion. In addition, it is not necessary to deposit a rough and thick layer of film on the surface of the CBN grits, as it has been found that wettability which is enhanced by chemical reactivity is substantially independant of the surface roughness of the film.

Preferrably this film is deposited onto the CBN grits by chemical vapor deposition. The advantage of using chemical vapor deposition for carbide film deposition is that better throwing power, ability to coat an irregular surface and shorter deposition time is achieved. The coated particles can be obtained discretely and can be readily used for brazing without the need for a post deposition process, such as leaching or milling as described in European patent no. 0 061 605.

To facilitate a better understanding of the invention, reference will now be made in the description to the following examples of the CBN abrasive tool and method for its manufacture. It is to be understood that the scope of the present invention is not limited to these examples, which are merely illustrative applications therof.

In relation to the following examples, it has been found that many brazing alloys, including but not limited to conventional Ni—Cr alloys, which just fail to effectively wet and bond uncoated CBN crystals, spontaneously wet the surface of CBN grit coated with a carbide selected from the group of carbides containing elements of the group IVA when brazing is carried out for just 5–10 minutes under an inert atmosphere below 1200° C. In these examples, Si—C has been used to coat the surface of the CBN grits, but it will be appreciated that other carbides containing elements in the group IVA may be used. The said abrasive film may be deposited on the CBN crystals by the conventional chemical vapor deposition technique at a temperature below 1200° C.

The tool fabrication process in the following examples can be divided into two parts, namely:
A. Coating the CBN particles with Si—C preferrably not above 1200° C. to avoid any thermal degradation of the CBN grits; and,
B. Brazing the coated particles to a metal, ceramic or cemented carbide substrate by an appropriate alloy, such as a Ni—Cr alloy, and preferrably below 1200° C.

A. Coating of CBN grits by CVD

The following examples are cited to demonstrate the capability of the conventional CVD technique for the deposition of Si—C on CBN crystals.

EXAMPLE 1

Microcrystalline CBN grits (e.g. BORAZON 570 and 550 from General Electric) in grit size B251 are inserted in a vertical CVD apparatus. The system is evacuated to about $1 \times 10^{-2}$ Torr. The temperature of the reactor is then raised to and maintained at 1150° C. To deposit the Si—C, a mixture of Trichlorosilane ($SiHCl_3$), hydrogen and methane is passed through the reactor at a system pressure of 20 Torr for 30 minutes. After completion of the deposition, the reactor is cooled down to 50° C. under an Argon atmosphere. The discrete Si—C coated microcrystalline CBN grits are thus obtained. Microscopic examination reveals that the resulting coating is crystalline, adherent as well as coherent.

EXAMPLE 2

The coating process is carried in the same manner as that of example 1, except that the CBN grits are monocrystalline (e.g. BORAZON 500 from General Electric and ABN 600 from De Beers). After carrying out the CVD process, discrete Si—C coated monocrystalline CBN grits are obtained. Microscopic examination reveals that the resulting coating is crystalline, adherent and coherent.

B. Brazing of Si—C coated grits to a suitable substrate

Suitable brazing materials which may be used include Ni or Co based alloys containing at least one of the transition elements such as Ti, Zr, Hf, V, Nb, Ta, Cr, Mo and W. In the following examples, alloys have been mainly selected from the group of conventional Ni—Cr brazing alloys, which are available commercially from several manufacturers and can wet and bond Si—C coated CBN grits at a temperature not above 1200° C.

It will be appreciated that a certain amount of one of the above transition elements or a mixture thereof should be present in the brazing alloy chosen so as to induce wetting. The selection of a braze alloy formulation may also be decided by the specific requirements of a particular abrasive tool, such as mechanical strength, wear resistance and tribological behaviour. Similarly, the brazing alloy may be chosen according to the desired brazing temperature and time, which depends on the solidus and liquidus points, fluidity and reactivity of the Si—C or other carbide film deposited on the CBN grits. It will also be appreciated that the parameters of the brazing process are chosen so that only a resticted reaction at the braze-film interface occurs and the required wetting and bonding are thus achieved without the formation of a detrimental phase at the interface. This latter could occur, for example, as the result of an overly vigorous reaction between the braze alloy and the film material under poorly chosen conditions of brazing temperature and duration.

EXAMPLE 1

A brazing material with a nominal composition of 76% Ni, 14% Cr and 10% P (NICROBRAZ 50/DEGUSSA 897) available in the form of a paste is applied to a steel substrate. The CBN grits coated with a film of Si—C deposited by CVD are then applied on the braze alloy layer in a monolayer. The assembly is then placed in a furnace chamber, which is evacuated to about $1 \times 10^{-2}$ Torr by a rotary pump, this value being the greatest vacuum normally created by such a pump.

The pump is stopped and backfilled with Argon until the pressure inside the brazing chamber becomes atmospheric. This is followed by the opening of the system to the atsmosphere. To protect the surface to be brazed and the brazing alloy against any microlevel oxidation by the residual oxygen left, which may affect the reproducibility of the process, some 5–10% vol. of hydrogen is also mixed with the Argon. The total gas flow rate is 2 liters/min.

The furnace is then heated to 1020° C. and kept at that temperature for 5 minutes. This is followed by cooling under the same atmospheric pressure. The tool thus produced consists of a monolayer of CBN crystals frimly bonded to the steel substrate.

EXAMPLE 2

The brazing is carried out in the same manner as that described in example 1 above, except that the substrate is a cemented carbide containing 94% WC and 6% Co. After brazing the coated CBN grits are seen to be held tenaciously by the braze to the cemented carbide substrate.

EXAMPLE 3

The brazing is carried out in the same manner as is described in example 1, except that the brazing material contains 25% Cr, 65% Ni and 10% P (NICROBRAZ 51). The brazing temperature is kept at 1020° C. during brazing. After this operation is finished, the CBN grits are seen to be strongly held in the brazed matrix.

EXAMPLE 4

The steps described in example 1 above are carried out, except that the brazing alloy consists of 82.4% Ni, 7% Cr, 3% Fe, 4.5% Si, 3.1% B (NICROBRAZ L. M./DEGUSSA 1002). The brazing temperature is held at around 1050° C. The brazing alloy is seen to wet the coated CBN grits and strongly bond them to the substrate.

EXAMPLE 5

The steps carried out in relation to example 1 above are performed, except that the brazing alloy consists of 74% Ni, 14% Cr, 4.5% Fe, 4.5% Si and 3% B (NICROBRAZ 125/DEGUSSA 1041) and the brazing is carried out at 1070° C. Satisfactory wetting is achieved after brazing.

Finally, it is to be understood that various modifications and/or additions may be made to the tool and its method of manufacture without departing from the ambit of the present invention as defined in the claims appended hereto.

We claim:

1. A CBN abrasive tool comprising a metal, ceramic or cemented carbide substrate and a single layer of CBN grits bonded to said substrate by a brazing alloy, wherein the surface chemistry of said CBN grits is modified by depositing thereon a film of silicon carbide.

2. A CBN abrasive tool according to claim 1, wherein said film is deposited on said CBN grits by chemical vapor deposition.

3. A CBN abrasive tool according to either of claims 1 or 2, wherein said film is deposited on said CBN grits at a temperature of 1200° C. or less.

4. A CBN abrasive tool according to claims 1 or 2 wherein said brazing alloy is a Ni or Co based alloy containing at least one of the transition elements Ti, Zr, Hf, V, Nb, Ta, Cr, Mo or W.

5. A CBN abrasive tool according to claim 3, wherein said brazing alloy is a Ni or Co based alloy containing at least one of the transition elements Ti, Zr, Hf, V, Nb, Ta, Cr, Mo or W.

* * * * *